United States Patent [19]
Ryu et al.

[11] Patent Number: 5,861,824
[45] Date of Patent: Jan. 19, 1999

[54] ENCODING METHOD AND SYSTEM, AND DECODING METHOD AND SYSTEM

[75] Inventors: Tadanori Ryu; Masashi Tokuda, both of Ikeda, Japan

[73] Assignee: Ricoh Company, Ltd., Tokyo, Japan

[21] Appl. No.: 776,994

[22] PCT Filed: Jun. 17, 1996

[86] PCT No.: PCT/JP96/01661

§ 371 Date: Feb. 6, 1997

§ 102(e) Date: Feb. 6, 1997

[87] PCT Pub. No.: WO97/01237

PCT Pub. Date: Jan. 9, 1997

[30] Foreign Application Priority Data

Jun. 20, 1995  [JP]  Japan  .................................. 7-152938
Sep. 5, 1995  [JP]  Japan  .................................. 7-227803

[51] Int. Cl.[6] .................................................. H03M 7/00
[52] U.S. Cl. .................................................. 341/50
[58] Field of Search .................................. 341/50, 51, 52, 341/55, 87, 95

[56] References Cited

U.S. PATENT DOCUMENTS 5,056,154  10/1991  Aono et al. .................................. 382/56

FOREIGN PATENT DOCUMENTS 6-261214  9/1994  Japan .................................. H04N 1/41

OTHER PUBLICATIONS

Yasuhiro Yamazaki, et al., Progressive Build–up Coding Scheme for Bi–level Images–JBIG Algorithm–, vol. 20, No. 1 (1991), Image Electronic Society Journal.

Information Technology–Coded Representation of Picture and Audio Information –Progressive Bi–Level Image Compression, ITU–T (Telecommunication Standardization Sector of ITU), T.82 (03/93), Terminal Equipment and Protocols for Telematic Services.

Primary Examiner—Brian Young
Attorney, Agent, or Firm—Cooper & Dunham LLP

[57] ABSTRACT

In S2, to-be-compressed image data is encoded and thus compressed each time when using a respective one of a plurality of templates. In S4, compression rates of encoded data are compared with each other which encoded data was encoded each time when a respective one of the plurality of templates was used in S2. In S6, encoded data having the highest compression rate and template identification information of a template used when the encoded data having the highest compression rate was obtained in S2 are output. The encoding comprises entropy encoding. The to-be-compressed data comprises video game software programs.

22 Claims, 8 Drawing Sheets

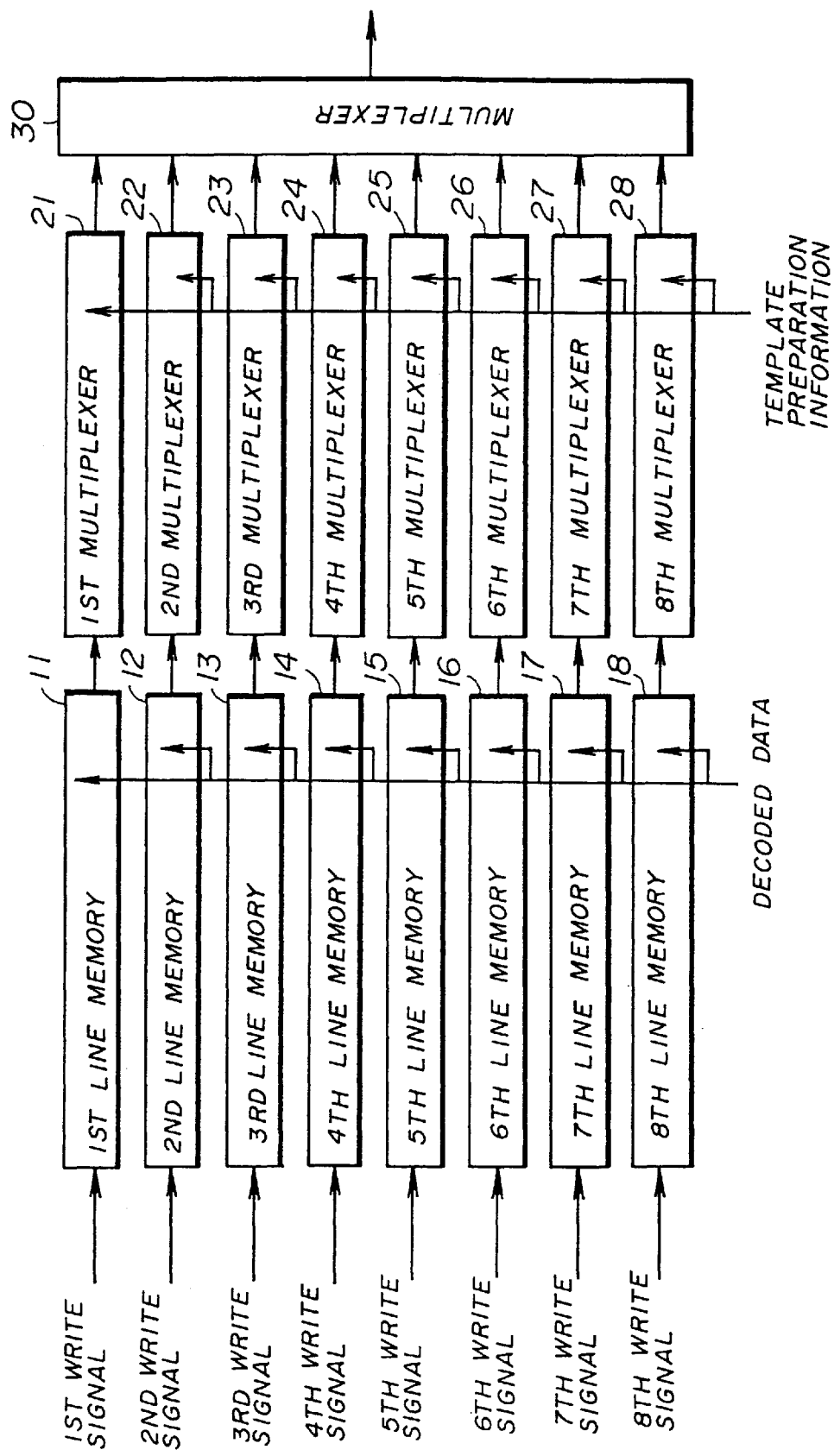

ENCODING METHOD AND SYSTEM, AND DECODING METHOD AND SYSTEM

TECHNICAL FIELD

The present invention relates to a data encoding and/or decoding method and system, and, in particular, to an encoding method and system, and a decoding method and system appropriate for compressing and decompressing computer data and game software programs.

BACKGROUND ART

The JBIG (Joint Bi-level Image Group) system was proposed as a new bi-level image encoding method which is appropriate not only for hard copy communication such as facsimile communication but also for soft copy communication such as computer image data communication.

FIG. 1 shows a block diagram illustrating a standard JBIG system. A first block 101 is an electric circuit which uses a PRES (Progressive REduction Scheme) as an image resolution reduction system. A second block 102 is an electric circuit for performing DP (Deterministic Prediction). The DP is used to deterministicly predict a value of a pixel which is being encoded from values of surrounding pixels which have already been encoded. By using the DP, it is possible to improve an encoding efficiency. A third block is an electric circuit for setting a model template. A template is a reference pixel model to be used in encoding. FIG. 2 shows an example of such a template. In the example, the template includes 10 pixels '1' to '10' surrounding a pixel to be encoded. Using such a template, encoding is performed using an $M_1$-order Markov model on a minimum resolution-reduced image. Specifically, $M_1$ pixels in proximity of each to-be-encoded pixel which have been already encoded are used as the reference pixels of the template. Possible states (combinations) of the values of the reference pixels are $2^{M_1}$ states. For each one of these states, a respective predetermined conditional probability of a symbol is given. Using thus given probabilities of the symbol for to-be-encoded pixels and actual values (symbols), entropy encoding is performed. A fourth block 104 is an entropy encoding circuit and uses the JBIG QM coder. (The JBIG QM coder is a QM coder used in the JBIG. Usually, an arithmetic encoder is called a QM coder. The JBIG is the general name of the bi-level data encoding standard in the ITU (International Telecommunication Union). In the JBIG, the QM coder is used for encoding bi-level data.)

As such a type of encoding system in the related art, a system in which a template is fixed, an adaptive template system (see Yasuhiro Yamazaki, Humitaka Ono, Tadashi Yoshida and Toshiaki Endo, *Progressive Build-up Coding Scheme for Bi-level Images -JBIG Algorithm-*, 1991, Vol.20, No.1, *Image Electronic Society Journal*), and a system in which a template is selected according to a type of data (for example, see Japanese Laid-Open Patent Application No.6-261214) have been proposed. Further, see *ITU-T (Telecommunication Standardization Sector of ITU)*, *T.82 (03/93), Terminal Equipment and Protocols for Telematic Services, Information Technology—Coded Representation of Picture and Audio Information—Progressive Bi-level Image Compression*, the teachings of which are hereby incorporated by reference, for the JBIG system.

In the system in which a template is fixed, based on statistics of compression rates in the system, the template which has the highest compression rate is determined and is used as the fixed template. In this system, a compression circuit can be simplified. However, in this system, when data which has characteristics significantly deviated from the average characteristics of the statistics, is encoded, a compression rate is degraded.

In the above-mentioned adaptive template system, during data compression, it is always determined which template results in the highest compression rate, and thus a template being used is dynamically changed. In this system, statistics are always taken and a template being used is changed according to the result of the statistics. Therefore, this system is appropriate for a case such as that where long data is encoded and characteristics of the data start to vary at a position of the data. However, if short data is processed, a time required for adaptively changing a template to be used makes up a significant portion of a whole compression processing period, and thus this system may not be an efficient compression system. Further, because which template is optimum is always determined, a circuit structure of the encoding/decoding apparatus will be complex.

In the system in which a template is selected according to a type of data, a respective template is provided to be used for compressing each one of a plurality of types of data. For example, when a color image is compressed, because each pixel comprises a plurality of bits, individual templates are used for a plurality of bit planes. However, in this method, because a template for each of the plurality of bit planes is fixed, the system is not satisfactory enough for a reason similar to the reason mentioned above for the above-described system in which a fixed template is used.

Further, a system, which processes color images in a manner in which a number of bits (number of bit planes) allocated for a single pixel varies, such as the above-described system in which a color image is processed, has been known. However, an encoding method in the related art can be applied only to a system in which a number of bit planes is fixed. Therefore, it has not been possible to apply a template-use encoding method to such a system which processes color images in a manner in which a number of bits allocated for a single pixel varies.

DISCLOSURE OF THE INVENTION

The present invention has been made as a result of considering the above-described circumstances, and an object of the present invention is to provide an encoding method and system, and a decoding method and system in which a template appropriate to particular data is determined in encoding and a high compression rate can be kept without causing circuit structures of encoding/decoding apparatus to be complex. Another object of the present invention is to apply an encoding method using a template to a system which processes color images in a manner in which a number of bits allocated for a single pixel varies.

An encoding method according to the present invention comprises the steps of:

a) (S2) encoding and thus compressing to-be-compressed data each time when using a respective one of a plurality of templates;

b) (S4) comparing compression rates of encoded data with each other which encoded data was encoded each time when a respective one of the plurality of templates was used in the step a); and c) (S6) outputting encoded data having the highest compression rate and template identification information of a template used when the encoded data having the highest compression rate was obtained in the step a).

Another encoding method according to the present invention comprises the steps of:

a) dividing to-be-compressed data into a plurality of bit planes of data;

b) encoding and thus compressing each bit plane of data each time when using a respective one of a plurality of templates;

c) for each bit plane of data, comparing compression rates of encoded data with each other which encoded data was encoded each time when a respective one of the plurality of templates was used in the step b); and d) for each bit plane of data, outputting encoded data having the highest compression rate and template identification information of a template used when the encoded data having the highest compression rate was obtained in the step b).

Another encoding method according to the present invention comprises the steps of:

a) dividing to-be-compressed data into a plurality of bit planes of data, a number of the plurality of bit planes of data being variable; and b) encoding and thus compressing each bit plane of data.

A decoding method according to the present invention comprises the steps of:

a) selecting a template of a plurality of templates, which template is to be used when decoding encoded data in a step b), using template identification information, the template having been used when encoded data having the highest compression rate was obtained through encoding; and b) decoding the encoded data using the template selected in the step a).

Another decoding method according to the present invention comprises the steps of:

a) for each bit plane of encoded data, selecting a template of a plurality of templates, which template is to be used when decoding encoded data in a step b), using template identification information, the template having been used when encoded data having the highest compression rate was obtained through encoding; and b) for each bit plane of encoded data, decoding the encoded data using the template selected in the step a).

Another decoding method according to the present invention comprises the steps of:

a) receiving encoded data which comprises a plurality of bit planes of data, a number of the plurality of bit planes of data being variable when the plurality of bit planes of data was obtained as a result of dividing to-be-compressed data; and b) decoding each bit plane of data of the plurality of bit planes of data.

Other objects and further features of the present invention will become more apparent from the following detailed description when read in conjunction with the accompanying drawings.

BRIEF DESCRIPTION OF THE DRAWINGS

FIG. 11 shows a partial block diagram of a fourth embodiment of the present invention.

BEST MODE FOR CARRYING OUT THE PRESENT INVENTION

With reference to drawings, preferred embodiments of the present invention will now be described.

Figure 3:
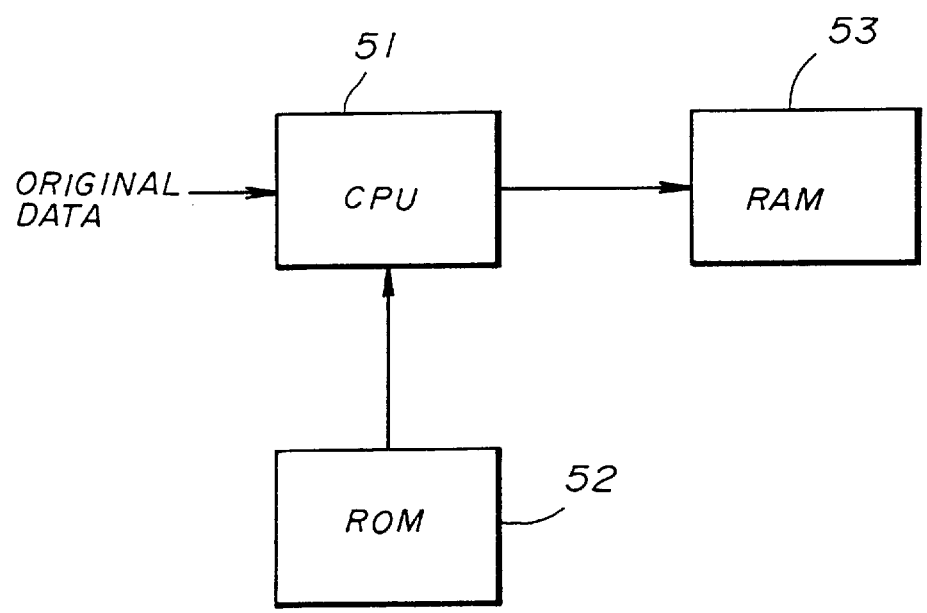
FIG. 3 shows a block diagram of a first embodiment of the present invention.
Figure 4:
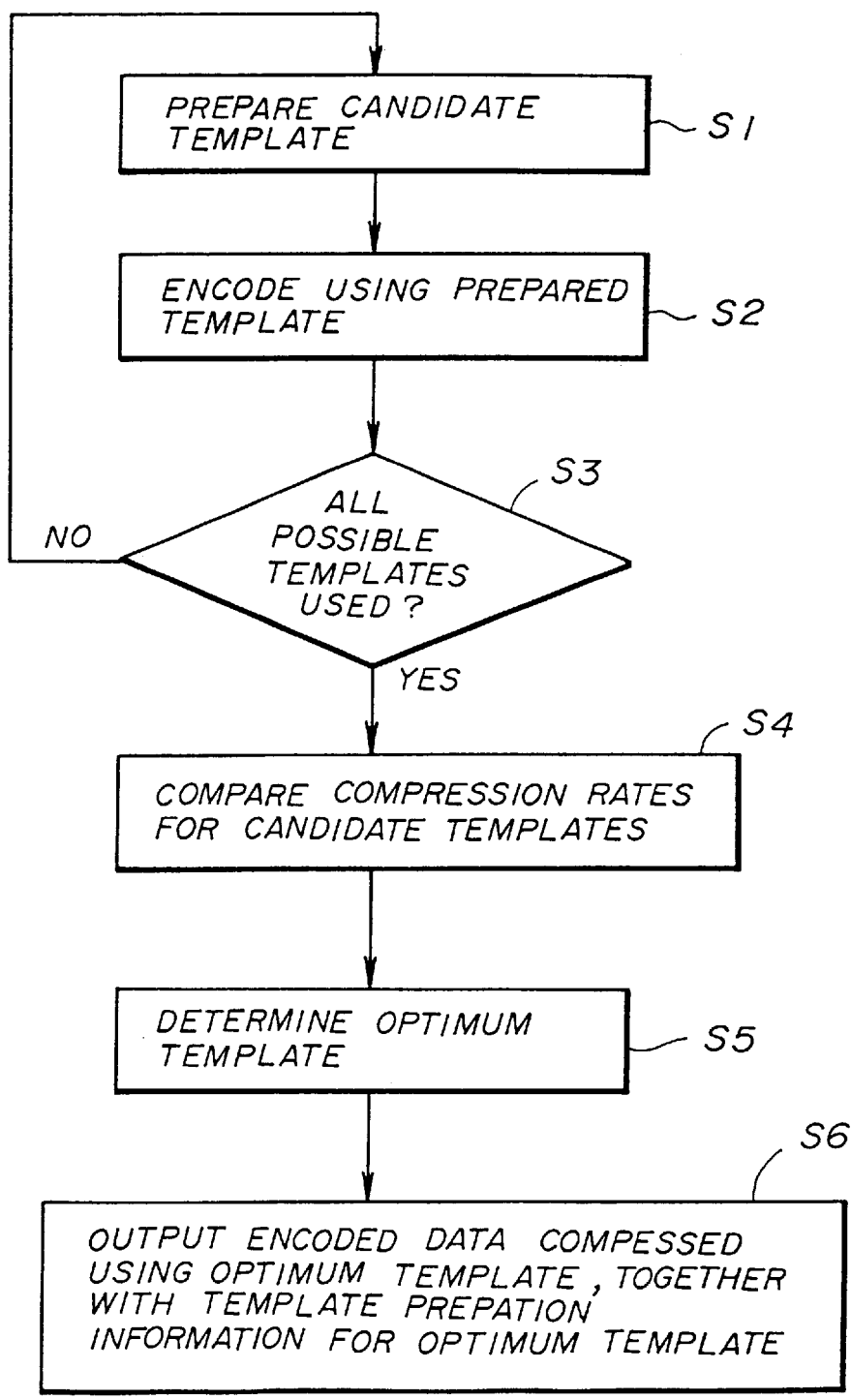
FIG. 4 shows a flowchart of an operation performed by a system shown in FIG. 3.
Figure 5:
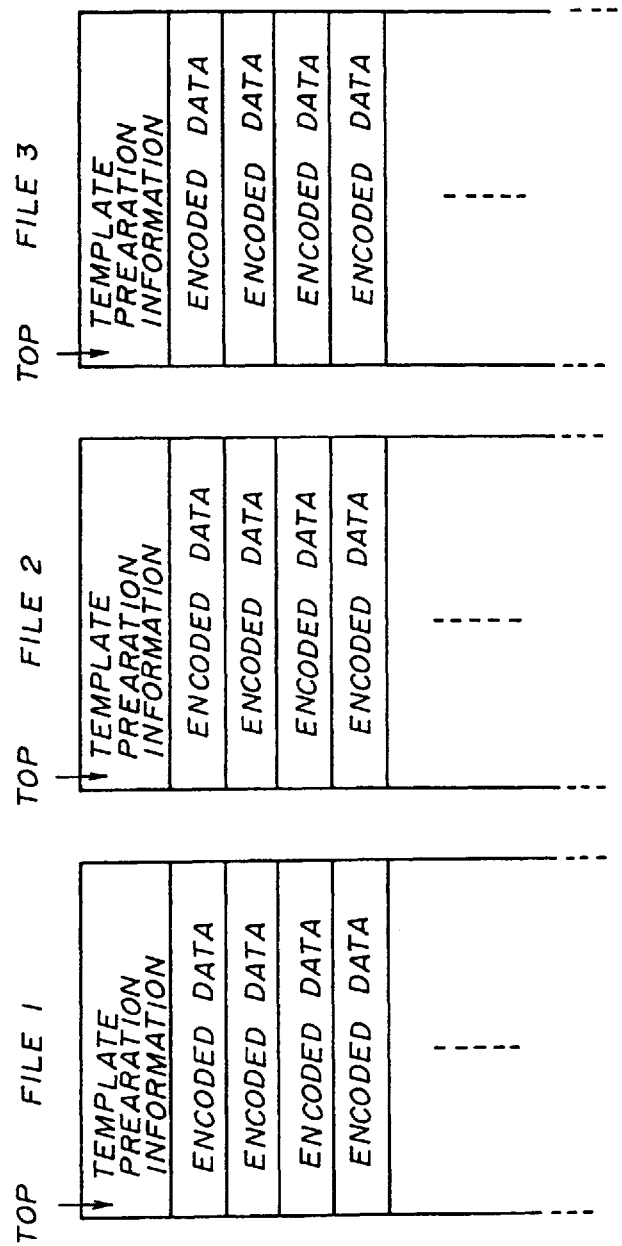
FIG. 5 shows a data structure of encoded data output by the system shown in FIG. 3.

FIG. 3 shows a block diagram of an encoding apparatus in a first embodiment of an encoding system and method in the present invention. FIG. 4 shows an operation flowchart of an encoding operation performed by the encoding apparatus shown in FIG. 3. FIG. 5 shows encode data structures which are supplied by the encoding apparatus shown in FIG. 3. The encoding operation is performed by a CPU 51 shown in FIG. 3 on supplied original data, using software programs previously stored in a ROM 52. The CPU 51 performs the operation shown in FIG. 4 as a result of executing the software programs. The CPU 51 performs the encoding operation and thus outputs encoded data which is written in a RAM 53. The encoded data written in the RAM 53 is used for storing the same data in a ROM which is connected to a decoding apparatus which decodes the encoded data stored in the ROM.

With reference to FIG. 4, a candidate template is prepared in S1. Specifically, for example, with reference to FIG. 2, a candidate template is produced by selecting six pixels from the ten pixels '1' to '10' shown in the figure for the to-be-encoded pixel. By this method, a total of $_{10}C_6$ combinations are possible and thus a total of $_{10}C_6$ candidate templates are produced. Further, by this method, it is possible to produce various shapes of templates.

In S2, a file of to-be-encoded data (to-be-compressed data) is encoded (compressed) using the candidate template prepared in S1. In S3, it is determined whether or not all the possible templates (all $_{10}C_6$ candidate templates) have been used for encoding the to-be-encoded data. If thy have not, another candidate template is produced in S1 and is used for encoding the same to-be-encoded data in S2. This operation is repeated until all the possible candidate templates have been used for encoding the same to-be-encoded data.

If all the candidate templates have been used, compression rates for the cases of using each of all the candidate templates are compared with each other in S4. Thereby, in S5, the optimum template is determined to be the template with the highest compression rate. Then, in S6, the encoded data obtained in the case of using the optimum template is output, together with template preparation information which is template identification data and is used by a decoding apparatus when decoding the encoded data for preparing the same template. The output data is written in the RAM 53.

Thus output data for files of to-be-encoded data have data structures shown in FIG. 4. Each data structure of the data structures includes a group of encoded data which is the encoded data output by the CPU 51 for a respective file of the to-be-encoded data. Each data structure further includes the above-mentioned template preparation information which is added at the top of the group of encoded data as shown in the figure.

Because files of supplied to-be-encoded data may have different characteristics, a template which is used for encoding a file of to-be-encoded data and as a result provides a highest compression rate may be different from a template which is used for encoding another file of to-be-encoded data and as a result provides a highest compression rate. Therefore, in the encoding apparatus in the first embodiment of the present invention, the optimum template is determined for each file of to-be-encoded data. In a case of encoding video game software programs, files of to-be-encoded data may include a background image, a character (person, animal, or the like) image and so forth. In such a case as that of video game software programs, generally speaking, each file of to-been-coded data has a small data amount. Therefore, the above-described method is advantageous because the operation shown in FIG. 4 is very simple and does not require a long time to perform.

Figure 6:
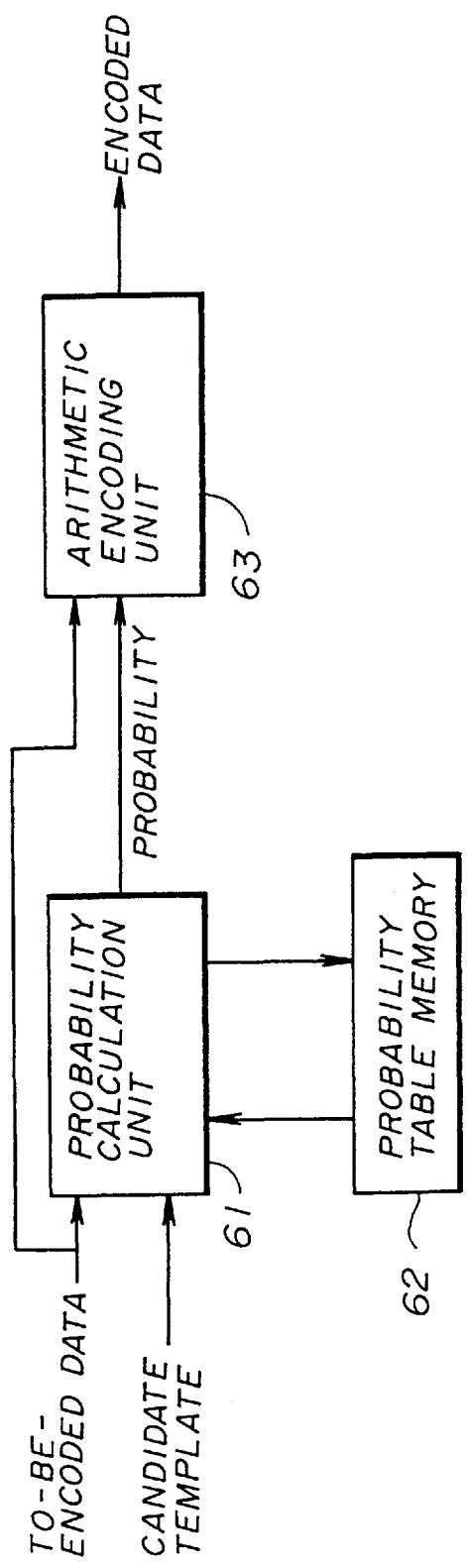
FIG. 6 shows a functional block diagram of a part for performing an encoding step shown in FIG. 4.

FIG. 6 shows a functional block diagram of a part of the encoding system shown in FIG. 3, which part performs the encoding step S2 shown in FIG. 4. The to-be-encoded data and information of a candidate template are supplied to a probability calculation unit 61. The probability calculation unit 61 obtains values of 6 reference pixels of the candidate template for a to-be-encoded pixel, and supplies the obtained 6 pixel values to a probability table memory 62 as an address. In the probability table memory 62, a respective probability is stored for each state of $2^6$ states (which are referred to as 'contexts') at a respective address. Such a probability is a probability that a to-be-encoded pixel has a value of a predetermined symbol (normally, MPS, '0'). In this case, the 6 reference pixels are used as a sixth Markov model and the possible $2^6$ states are defined as the contexts (which are represented by integers). The probability table memory 62 receives the 6 pixel values as the address, and outputs the respective probability to an arithmetic encoding unit 63. The arithmetic encoding unit 63 performs arithmetic encoding (which is one of entropy encoding) using the probability and the actual value of the to-be-encoded pixel.

Generally speaking, in entropy encoding such as the arithmetic encoding, a compression rate can be improved as prediction of a value of a to-be-encoded pixel is improved. That is, since an actual possibility that a to-be-encoded pixel has a symbol which was previously predicted therefor is higher, a resulting compression rate can be improved. In order to improve the possibility, a template is demanded appropriate for the characteristics of a particular to-be-encoded image data file.

Figure 1:
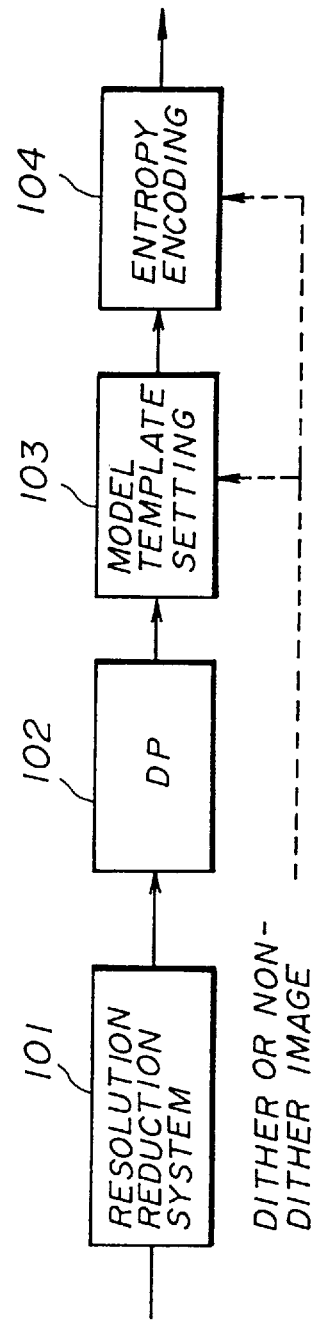
FIG. 1 shows a block diagram of a JBIG standard system.

Any template-use encoding system in the related art such as that shown in FIG. 1 can be used for performing the encoding system shown in FIG. 3. In a case where the system shown in FIG. 1 is used, the encoding step S2 shown in FIG. 4 is performed by the entropy encoding circuit 104. In the third block 103, a candidate template preparation in S1 shown in FIG. 4 is performed. The above-mentioned $M_1$ reference pixels of the template are six reference pixels of the template. Then, entropy encoding similar to the entropy encoding performed through the block 104 shown in FIG. 1 is performed through entropy encoding means (which can be embodied by the CPU 51 with the software programs) similar to the block 104 repeatedly for each one of all of the above-mentioned candidate templates.

A decoding method and system in a second embodiment of the present invention will now be described. In this method, an appropriate template is prepared using the above-described template preparation information accompanying each encoded data file. The prepared template is used for decoding the encoded data file.

Figure 7:
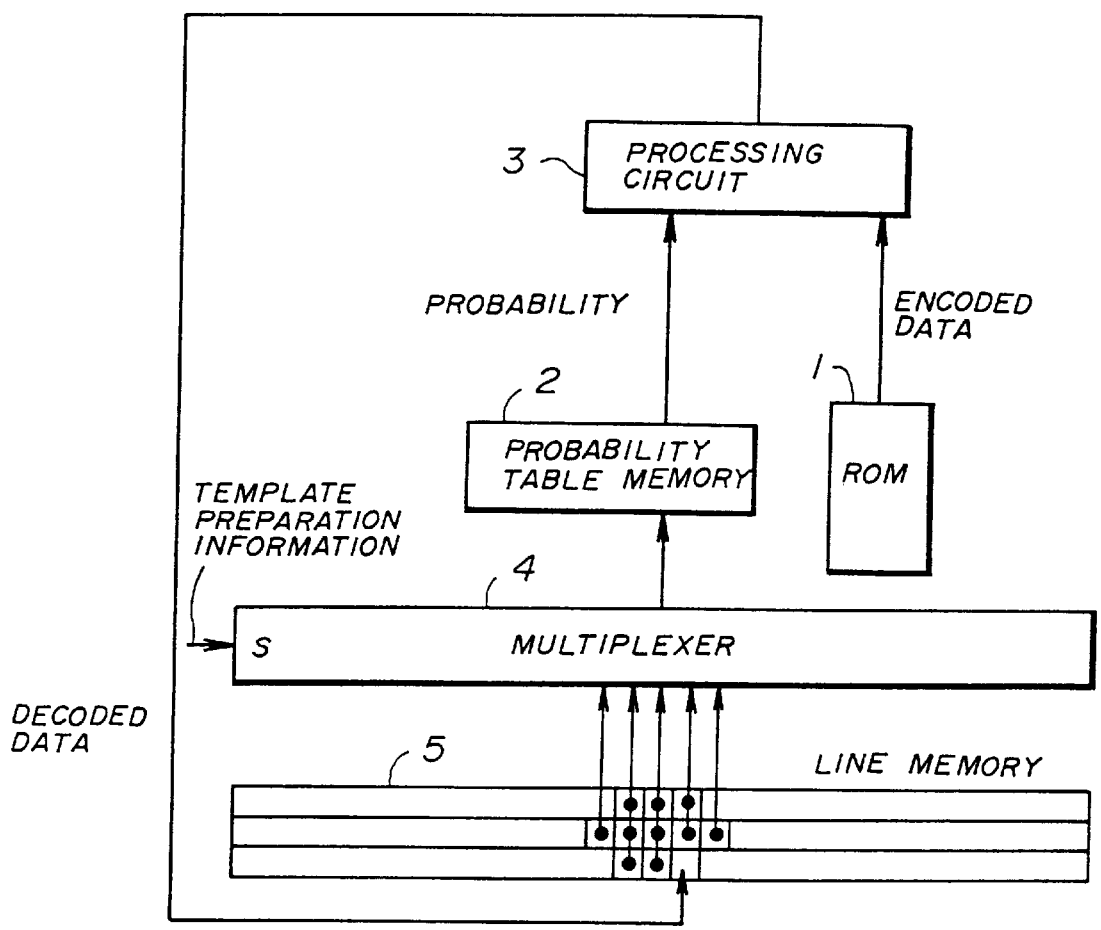
FIG. 7 shows a block diagram of a second embodiment of the present invention.

FIG. 7 shows a general block diagram of a ROM-cartridge system in the second embodiment of the present invention. A ROM cartridge (ROM 1 shown in the figure) containing video game software programs in a form of encoded image data is connected to this ROM-cartridge system which decodes the encoded image data. The encoded image data may be an encoded data file which is supplied by the encoding system in the first embodiment of the present invention shown in FIG. 3.

A line memory 5 stores three lines of data which have been obtained as a result of decoding the encoded image data. Through memory reading means (not shown in the figure), ten pixels of decoded data located in ten pixels '1' to '10' shown in FIG. 2 for a to-be-decoded pixel is read from the line memory 5. The read decoded data is supplied to a multiplexer 4.

The multiplexer 4 selects 6 pixels of data from the supplied ten pixels of decoded data according to the template preparation information. The template information is stored in the ROM 1 and accompanies the encoded data file in the ROM 1 as shown in FIG. 5. The template information is read out from the ROM 1 when the encoded data file is decoded, and is supplied the multiplexer 4 through a buffer memory (not shown in the figure). The multiplexer 4 supplies the selected 6 pixels of data to a probability table memory 2 as an address, which probability table memory is identical to the probability table memory 62 shown in FIG. 6.

The probability table memory 2 receives the 6 pixels of data, uses it as the address thereof and outputs an above-mentioned symbol appearance probability stored at the address.

A processing circuit 3 uses the encoded data read out from the ROM 1 and probability data read out from the probability table memory 2, and produces a decoded bit sequentially as a result of thus decoding the encoded data. The produced decoded bit is supplied to and stored in the line memory 5 sequentially. Then, when a subsequent pixel is decoded, ten pixels of data supplied from the line memory to the multiplexer are shifted by one pixel rightward in FIG. 7, and an operation similar to the operation described above is performed subsequently for the current to-be-decoded pixel.

In the encoding method and system, and decoding method and system according to the present invention described above, after encoding is performed for several candidate templates on to-be-compressed data, a template having a highest compression rate is determined and compressed data obtained through the template is output. Therefore, it is possible to totally improve a compression rate, in comparison to the above-described template fixing system and system in which a template is selected according to a data type but a template is fixed for each data type in the related art. Further, in the present invention, an operation of always determining which template is optimum during compression is not performed. Thereby, a circuit structure of an encoding/decoding circuit will not be complex.

A third embodiment of the present invention will now be described. In the embodiment, image data is divided into a plurality of bit planes of image data and encoding is performed for each bit plane. A number of bit planes is variable. An encoding system in the third embodiment has a hardware arrangement same as the hardware arrangement of the system in the first embodiment shown in FIG. 3.

Figure 8:
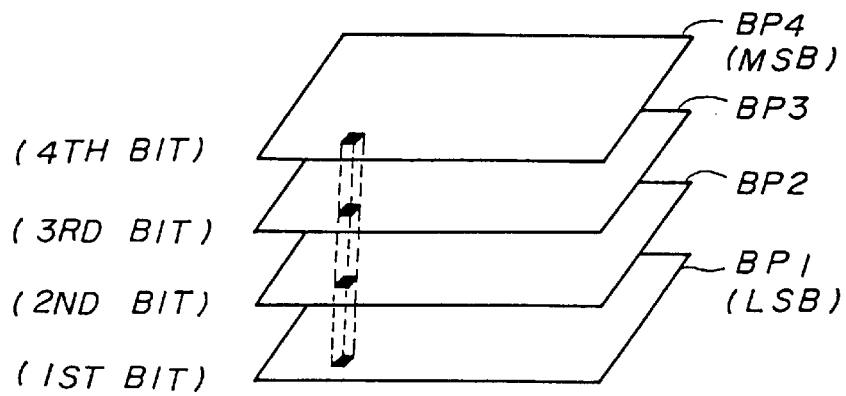
FIG. 8 shows a data structure of image data processed by a third embodiment of the present invention.
Figure 9:
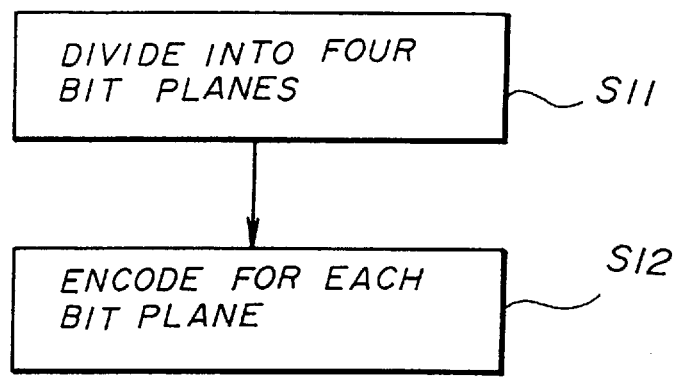
FIG. 9 shows a flowchart of the third embodiment of the present invention.

When multi-level image data in which a pixel has four bits is encoded, for example, in S11 shown in FIG. 9, the multi-level image data is divided into four bit planes BP1, BP2, BP3 and BP4 as shown in FIG. 8. Bits at each same place of the four-place bits of pixels are contained in a respective one of the four bit planes.

Figure 2:
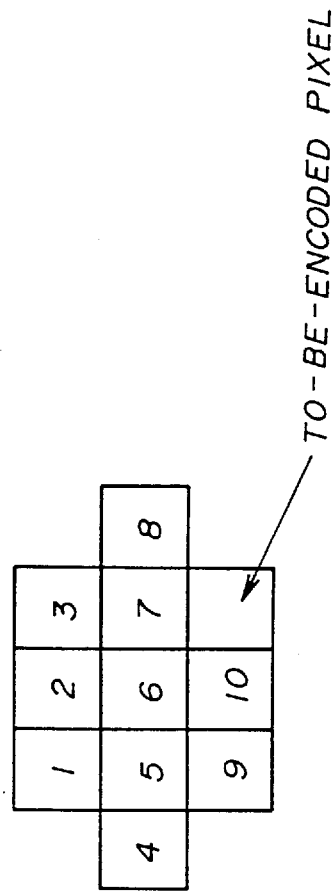
FIG. 2 illustrates a template.

In S12 shown in FIG. 9, encoding is performed on the image data for each bit plane. In S12, a template including the ten pixels '1' to '10' shown in FIG. 2 is used as the reference pixels for each to-be-encoded pixel. Then, a Markov state is determined for ten pixel values of the reference pixels and a symbol appearance probability is determined for the determined Markov state for the to-be-encoded pixel in a manner similar to the manner described above using the probability table memory 62 shown in FIG. 6. Then, the to-be-encoded pixel is encoded in a manner similar to the manner described above using the arithmetic encoding unit 63 shown in FIG. 6.

It is also possible that, as in the above-described first embodiment, an arbitrary six pixels are selected from the ten pixels shown in FIG. 2 for the template. In this case, encoding is performed using several candidate templates and encoded data of a highest compression rate is output for each bit plane.

Figure 10:
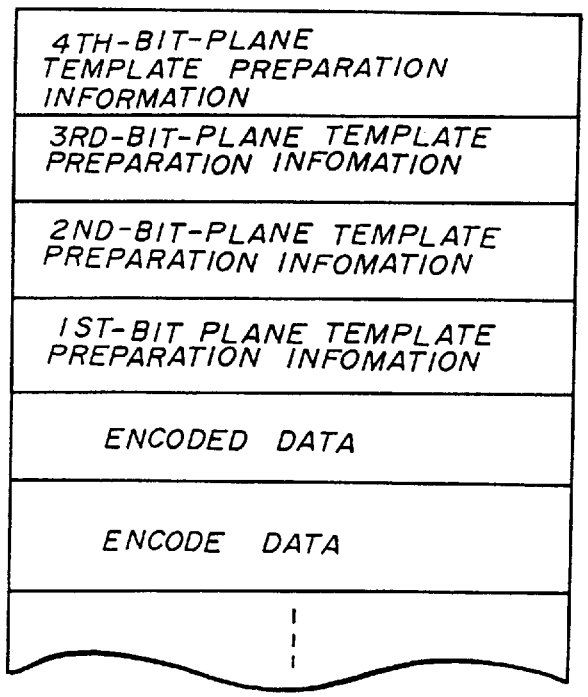
FIG. 10 shows a data structure of encoded data output by an encoding system in the third embodiment.

In order to make the number of bit planes variable, a number of templates for the maximum number (for example, 'four') of bit planes are prepared. Then, when particular multi-level image data in which each pixel has two bits is encoded, a number (in this example, 'two') of templates from the prepared number (in this example, 'four') of templates are used. In a case where an optimum template is selected from several candidate templates for each bit plane as mentioned above, similar to the case of the first embodiment, for example, six arbitrary pixels are selected from the ten pixels for each candidate template. In this case, as shown in FIG. 10, 4th-bit-plane, 3rd-bit-plane, 2nd-bit-plane and 1st-bit-plane template preparation information accompanies encoded data of the 4th (bit place) bit plane, 3rd bit (bit place) bit plane, 2nd (bit place) bit plane and 1st (bit place) bit plane, and indicates templates, each of which template has been used for encoding and thus produces the encoded data of a respective one of the four (bit places) bit planes.

A decoding method and system in a fourth embodiment of the present invention will now be described. This decoding system can decode multi-level image data having a number of bit planes, which number is different from a number of bit planes of other multi-level image data which can also be decoded in the same system. In this decoding method, similar to the above-described method in the first embodiment, a template appropriate for decoding encoded data is set using the template preparation information accompanying the encoded data, and decoding is performed using the set template.

The decoding system in the fourth embodiment performing the decoding method has a general arrangement similar to the general arrangement of the decoding system in the second embodiment shown in FIG. 7. In the decoding system in the fourth embodiment, instead of the line memory 5 and multiplexer 4 in the second embodiment, eight line memories 11 to 18, eight multiplexers 21 to 28 and another multiplexer 30 are provided. FIG. 11 shows a general block diagram of this part of the decoding system.

This system in the fourth embodiment can process multi-level image data having a maximum of 8 bit planes. The eight line memories, a first line memory 11 to an eighth line memory 18 are provided for the 8 bit planes, respectively. Each line memory has a structure similar to the structure of the line memory 3 in the second embodiment shown in FIG. 7. Data writing operations in the line memories 11 to 18 are controlled by eight write signals, a first write signal to an eight write signal, respectively. For example, when multi-level image data having two bit planes is processed, the data writing operations on the first and second line memories 11 and 12 are alternately performed. When multi-level image data having four bit planes is processed, the data writing operations on the first to fourth line memories 11 to 14 are sequentially, alternately performed. When multi-level image data having eight bit planes is processed, the data writing operations on the first to eighth line memories 11 to 18 are sequentially, alternately performed. Control of the write signals can be easily performed using a counter for performing the above-described sequential, alternate operations.

The eight multiplexers, a first multiplexer 21 to an eighth multiplexer 28 are connected with the eight line memories 11 to 18, respectively. A number of multiplexers of the eight multiplexers 21 to 28 set templates for the bit planes using the template preparation information supplied for the bit planes. This number of multiplexers are the multiplexers connected with a number of line memories of the eight line memories, which number corresponds to the number of the bit planes of the given multi-level image data. The other multiplexer 30 sequentially selects one of outputs of the above-mentioned number of multiplexers, and supplies the selected output to a probability table memory (not shown in the figure) as an address thereof. The probability table memory is identical to the probability table memory 2 in the second embodiment shown in FIG. 7. A remaining part of the decoding operation is similar to the decoding operation of the decoding system in the second embodiment shown in FIG. 7. In the decoding system in the fourth embodiment, decoding is performed sequentially, alternately for the number of bit planes.

Thus, according to the present invention, the above-described template-use encoding and decoding can be applied to an image processing system which processes multi-level image data in which a number of bits of each single pixel may vary, that is, the multi-level image data in which a number of bit planes may vary. For example, when image data of video game software programs is processed, a background image data file has four bit planes while a character (person, animal or the like) image data file has two bit planes. By providing the arrangement such as that shown in FIG. 11, it is possible that the single decoding system can decode both the four-bit-plane background image file and the two-bit-plane character image file.

It is also possible that each of the above-described second embodiment described with reference to FIG. 7 and the fourth embodiment described with reference to FIG. 11 is embodied by a hardware structure such as that shown in FIG. 3. In this case, the entire operation is performed as a result of a CPU executing an appropriate software programs.

The present invention is not limited to the above-described embodiments, and variations and modifications may be made without departing from the scope of the present invention.

INDUSTRIAL APPLICABILITY

Thus, according to the present invention, an encoding method and system, and a decoding method and system can be provided in which a template appropriate to particular data is determined in encoding and a high compression rate can be kept without causing circuit structures of encoding/decoding apparatus to be complex. Further, an encoding method using a template can be applied to a system which processes color images in a manner in which a number of bits allocated for a single pixel varies. Therefore, the present invention is particularly useful when being applied to an encoding method and system, and a decoding method and system for compressing and decompressing computer data and game software programs.

We claim:

1. An encoding method comprising the steps of:
   a) (S2) encoding and thus compressing to-be-compressed data each time when using a respective one of a plurality of templates;
   b) (S4) comparing compression rates of encoded data with each other which encoded data was encoded each time when a respective one of said plurality of templates was used in said step a); and
   c) (S6) outputting encoded data having the highest compression rate and template identification information of a template used when said encoded data having the highest compression rate was obtained in said step a).

2. The encoding method according to claim 1, wherein said encoding comprises entropy encoding.

3. The encoding method according to claim 1, wherein said to-be-compressed data comprises video game software image data.

4. An encoding method comprising the steps of:
   a) (S11) dividing to-be-compressed data into a plurality of bit planes of data;
   b) (S12) encoding and thus compressing each bit plane of data each time when using a respective one of a plurality of templates;
   c) (S4) for each bit plane of data, comparing compression rates of encoded data with each other which encoded data was encoded each time when a respective one of said plurality of templates was used in said step b); and
   d) (S6) for each bit plane of data, outputting encoded data having the highest compression rate and template identification information of a template used when said encoded data having the highest compression rate was obtained in said step b).

5. An encoding method comprising the steps of:
   a). (S11) dividing to-be-compressed data into a plurality of bit planes of data, a number of said plurality of bit planes of data being variable; and
   b) (S12) using a template including reference data for each bit plane of data and encoding and thus compressing each bit plane of data.

6. A decoding method comprising the steps of:
   a) selecting a template of a plurality of templates, which template is to be used when decoding encoded data in a step b), using template identification information; said template having been used when encoded data having the highest compression rate was obtained through encoding; and
   b) decoding said encoded data using said template selected in said step a).

7. The decoding method according to claim 6, wherein said encoding comprises entropy encoding.

8. The decoding method according to claim 6, wherein said encoded data comprises video game software image data.

9. A decoding method comprising the steps of:
   a) for each bit plane of encoded data, selecting a template of a plurality of templates, which template is to be used when decoding encoded data in a step b), using template identification information, said template having been used when encoded data having the highest compression rate was obtained through encoding; and
   b) for each bit plane of encoded data, decoding said encoded data using said template selected in said step a).

10. A decoding method comprising the steps of:
    a) receiving encoded data including template preparation information, said received encoded data comprising a plurality of bit planes of data, a number of said plurality of bit planes of data being variable when said plurality of bit planes of data were obtained as a result of dividing to-be-compressed data; and
    b) setting a template appropriate for decoding encoded data using the template preparation information and decoding each bit plane of data of said plurality of bit planes of data using the template.

11. An encoding system comprising:
    encoding means for encoding and thus compressing to-be-compressed data each time when using a respective one of a plurality of templates;
    comparing means for comparing compression rates of encoded data with each other which encoded data was encoded each time when a respective one of said plurality of templates was used by said encoding method; and
    outputting means for outputting encoded data having the highest compression rate and template identification information of a template used when said encoded data having the highest compression rate was obtained by said encoding means.

12. An encoding system comprising:
    dividing means for dividing to-be-compressed data into a plurality of bit planes of data;
    encoding means for encoding and thus compressing each bit plane of data each time when using a respective one of a plurality of templates;
    comparing means, for each bit plane of data, for comparing compression rates of encoded data with each other which encoded data was encoded each time when a respective one of said plurality of templates was used by said encoding means; and
    outputting means, for each bit plane of data, outputting encoded data having the highest compression rate and template identification information of a template used when said encoded data having the highest compression rate was obtained by said encoding means.

13. An encoding system comprising:
    dividing means for dividing to-be-compressed data into a plurality of bit planes of data, a number of said plurality of bit planes of data being variable; and
    encoding means for using a template including reference data for each bit plane of data and encoding and thus compressing each bit plane of data.

14. A decoding system comprising:
    selecting means (4) for selecting a template of a plurality of templates, which is to be used when decoding encoded data by decoding means, using template identification information, said template having been used when encoded data having the highest compression rate was obtained through encoding; and
    said decoding means (3) for decoding said encoded data using said template selected by said selecting means.

15. A decoding system comprising:

selecting means (21 to 28), for each bit plane of encoded data, selecting a template of a plurality of templates, which is to be used when decoding encoded data by decoding means, using template identification information, said template having been used when encoded data having the highest compression rate was obtained through encoding; and said decoding means (3), for each bit plane of encoded data, decoding said encoded data using said template selected by said selecting means.

16. A decoding system comprising:

receiving means for receiving encoded data including template preparation information, said received encoded data comprising a plurality of bit planes of data, a number of said plurality of bit planes of data being variable when said plurality of bit planes of data was obtained as a result of dividing to-be-compressed data; and decoding means (3) for setting a template appropriate for decoding encoded data using the template preparation information and decoding each bit plane of data of said plurality of bit planes of data using the template.

17. A computer memory product comprising a computer usable medium having computer-readable program code means embodied therein, said computer-readable program code means comprising:

first computer-readable program code means (S2) for encoding and thus compressing to-be-compressed data each time when using a respective one of a plurality of templates;

second computer-readable program code means (S4) for comparing compression rates of encoded data with each other which encoded data was encoded each time when a respective one of said plurality of templates was used by said first computer-readable program code means; and third computer-readable program code means (S6) for outputting encoded data having the highest compression rate and template identification information of a template used when said encoded data having the highest compression rate has been obtained by said second computer-readable program code means.

18. A computer memory product comprising a computer usable medium having computer-readable program code means embodied therein, said computer-readable program code means comprising:

first computer-readable program code means (S11) for dividing to-be-compressed data into a plurality of bit planes of data;

second computer-readable program code means for encoding and thus compressing each bit plane of data each time when using a respective one of a plurality of templates;

third computer-readable program code means (S4), for each bit plane of data, for comparing compression rates of encoded data with each other which encoded data was encoded each time when a respective one of said plurality of templates was used by said second computer-readable program code means; and fourth computer-readable program code means (S6), for each bit plane of data, for outputting encoded data having the highest compression rate and template identification information of a template used when said encoded data having the highest compression rate was obtained by said second computer-readable program code means.

19. A computer memory product comprising a computer usable medium having computer-readable program code means embodied therein, said computer-readable program code means comprising:

first computer-readable program code means (S11) for dividing to-be-compressed data into a plurality of bit planes of data, a number of said plurality of bit planes of data being variable; and second computer-readable program code means (S12) for encoding and thus compressing each bit plane of data.

20. A computer memory product comprising a computer usable medium having computer-readable codes embodied therein, said computer-readable codes comprising:

encoded data; and template identification information of a template having been used when said encoded data having the highest compression rate was obtained through encoding.

21. A computer memory product comprising a computer usable medium having computer-readable codes embodied therein, said computer-readable codes comprising:

a plurality of bit planes of encoded data; and template identification information, for each bit plane of encoded data, of a template having been used when said encoded data having the highest compression rate was obtained through encoding.

22. A computer memory product comprising a computer usable medium having computer-readable codes embodied therein, said computer-readable codes comprising a plurality of bit planes of encoded data encoded using a template including reference data, a number of said plurality of bit planes of data being variable when said plurality of bit planes of data were obtained as a result of dividing to-be-compressed data.

* * * * *